(12) United States Patent
Katayama

(10) Patent No.: US 7,197,731 B2
(45) Date of Patent: Mar. 27, 2007

(54) VIRTUAL COMPONENT HAVING A DETACHABLE VERIFICATION-SUPPORTING CIRCUIT, A METHOD OF VERIFYING THE SAME, AND A METHOD OF MANUFACTURING AN INTEGRATED CIRCUIT

(75) Inventor: Isao Katayama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 559 days.

(21) Appl. No.: 10/105,367

(22) Filed: Mar. 26, 2002

(65) Prior Publication Data
US 2002/0138814 A1    Sep. 26, 2002

(30) Foreign Application Priority Data
Mar. 26, 2001 (JP) ............................. 2001-087045

(51) Int. Cl.
*G06F 17/50* (2006.01)
(52) U.S. Cl. ............................................. 716/5; 716/4
(58) Field of Classification Search ................ 716/1–5, 716/6, 18; 703/14–17
See application file for complete search history.

(56) References Cited

U.S. PATENT DOCUMENTS

| 5,717,696 | A | | 2/1998 | Gabillard et al. | |
|---|---|---|---|---|---|
| 5,911,059 | A | * | 6/1999 | Profit, Jr. | 703/23 |
| 5,933,356 | A | * | 8/1999 | Rostoker et al. | 703/15 |
| 5,991,533 | A | * | 11/1999 | Sano et al. | 703/28 |
| 6,096,092 | A | * | 8/2000 | Takahashi et al. | 716/18 |
| 6,167,363 | A | * | 12/2000 | Stapleton | 703/14 |
| 6,269,467 | B1 | * | 7/2001 | Chang et al. | 716/1 |
| 6,400,173 | B1 | * | 6/2002 | Shimizu et al. | 324/765 |
| 6,526,561 | B2 | * | 2/2003 | Yokoyama et al. | 716/18 |
| 6,631,504 | B2 | * | 10/2003 | Dervisoglu et al. | 716/4 |
| 6,654,935 | B2 | * | 11/2003 | Ara et al. | 716/4 |
| 6,701,474 | B2 | * | 3/2004 | Cooke et al. | 714/724 |
| 6,725,432 | B2 | * | 4/2004 | Chang et al. | 716/4 |
| 6,775,810 | B2 | * | 8/2004 | Chang et al. | 716/4 |
| 6,879,927 | B1 | * | 4/2005 | Lu | 702/123 |
| 6,901,562 | B2 | * | 5/2005 | Cooke et al. | 716/1 |

FOREIGN PATENT DOCUMENTS

| JP | 8-125024 | 5/1996 |
|---|---|---|
| JP | 10/315471 | 12/1998 |

* cited by examiner

*Primary Examiner*—Vuthe Siek
*Assistant Examiner*—Binh Tat
(74) *Attorney, Agent, or Firm*—Oblon, Spivak, McClelland, Maier & Neustadt, P.C.

(57) ABSTRACT

A computer readable medium encoded with a hardware description language describing a virtual component for an integrated circuit design, the virtual component comprising a virtual component body having at least one circuit function and a verification-supporting circuit detachably connected to the virtual component body. The verification-supporting circuit may include a verification-output terminal described by the hardware description language. The verification-output terminal is configured to output a signal indicating an operation state inside of the virtual component body, and is detachably connected to the virtual component body so as not to affect the operation of the virtual component body even when the connection of the verification-output terminal with the virtual component body is cut.

5 Claims, 9 Drawing Sheets

```
module Compo23A(sysclk, reset
    , in00sig, in01sig, ...
    , out00sig, out01sig, ...);
input sysclk, reset;
input in00sig, in01sig, ... ;      /* Input Terminals */
output out00sig, out01sig, ...;    /* Output Terminals */ wire Internal00Wire;               /* Internal Wire */
wire Internal01Wire;               /* Not described */
wire Internal02Wire;               /* in Specification */
wire Internal03Wire;
             :
/* Circuit Description */
             :
             :

ifdef Debug
                                   /* Embedded Terminals Described in Specification */
wire [31:0] oStatusCode;           /* Output */
wire [31:0] oConditionCode;
wire [31:0] oActiveRatio;
wire [31:0] oErrorCount;
wire [31:0] oWaitCount;
wire oChangeState;

reg  [31:0] rPreviousData;
wire [31:0] oPreviousData;
wire oSeriousError;
wire oHald;
             :
wire i00Condition;                 /* Input */
wire i01Condition;
wire i02Condition;
```

FIG. 2A

```
                         /* Connections to Circuit Component */
                         /* Not Described in Specification */
assign oStatusCode = Internal84Wire;
assign oConditionCode = Internal07Wire;
assign oActiveRatio = Internal84Wire / Internal12Wire * 100;
assign oErrorCount = Internal34Wire;
assign oWaitCount = (Internal34Wire == 1'b0) ? Internal43Wire : Internal32Wire;
assign oSeriousError = Internal32Wire | Internal33Wire | Internal49Wire;
assign oChangeState = (Internal61Wire == Internal62Wire) ? 1'b0 : 1'b1;
always @ (oChangeState) rPreviousData = Internal22Wire;
assign oPreviousdata = rPreviousdata;
assign oHalt = Internal33Wire;
                         :
 endif
endmodule `ifdef StandAlone module Driver23A;            /* Driver for Compo23A */
reg sysclk, reset;
reg in00sig, in01sig, ....;
wire out00sig, out01sig, ....;
                         /* Connection */
Compo23A Compo23A(sysclk, reset
    , in00sig, in01sig, ...
    , out00sig, out01sig, ...);
parameter CLK = 10;          /* Definition of Clock Cycle */
always #(CLK/2) sysclk = ~sysclk;  /* Clock Driver */
initial begin
    sysclk = 1'b1;
end
```

FIG. 2B

```
                              /* Reset & Signal Generator */
initial begin
    reset = 1'b1;              /* Reset */
    $readmemh(TestSignal, rSignal);
#(CLK * 10 + 2)
    reset = 1'b0;              /* End of Reset */
    iDataNum = 0;              /* Signal Generator */
    for (iLoopCount = 0; iLoopCount < MAX_SIGNAL
         ; iLoopCount = iLoopCount + 1) begin
        rSignalTemp = rSignal[iLoopCount];
        rIn00Sig = rSignalTemp[179];        /* Driving Terminals of Component */
        rIn01Sig = rSignalTemp[178];
        rIn02Sig = rSignalTemp[177];
                  :
#(CLK);
    end
end
 ifdef ExternalMonitor
include "DebugEnv";
 else
assign Compo23A.i00Condition = 1'b0;   /* Default Condition */
assign Compo23A.i01Condition = 1'b0;
assign Compo23A.i02Condition = 1'b0;
 endif end module;
 endif
```

FIG. 2C

```
/* Debug Environment */

/* Input Signal Data */
parameter TestSignal = "SigNo453.dat"

/* Signal Monitor */
always @ (Compo23A.wSeriousError == 1'b1) begin
    $display ("#### Serious Error Detected!! ####");
    $finish;
end always @ (Compo23A.wHalt == 1'b1) begin
    $display ("#### Stop Because of Halt ####");
    $finish;
end
                    :
initial begin
    $monitor ("Status: %h ", Compo23A.oStatusCode
        , "Condition: %h ", Compo23A.oConditionCode
        , "Active: %h ", Compo23A.oActiveRatio
        , "Error: %h ", Compo23A.oErrorCount
        , "Wait: %h ", Compo23A.oWaitCount
    );
end
                    :

/* Condition Settings for Debug */
assign Compo23A.i00Condition = 1'b1;    /* Condition */
assign Compo23A.i01Condition = 1'b0;
assign Compo23A.i02Condition = 1'b0;
                    :
```

FIG. 3A

```
/* Status Monitor */
always @ (Compo23A.oActiveRatio < 32'h00000012) begin
    $display("Low Active Ratio");
end always @ (Compo23A.oConditionCode == 32'hFFFFFFFF) begin
    $display("Now Waiting");
end
              :
```

FIG. 3B

VIRTUAL COMPONENT HAVING A DETACHABLE VERIFICATION-SUPPORTING CIRCUIT, A METHOD OF VERIFYING THE SAME, AND A METHOD OF MANUFACTURING AN INTEGRATED CIRCUIT

CROSS-REFERENCE TO RELATED APPLICATION

This application claims the benefit of priority from prior Japanese Patent Application No. P2001-087045, filed on Mar. 26, 2001; the entire content of which is incorporated herein by reference.

FIELD OF THE INVENTION

The present invention relates to a circuit design resource of large scale integrated circuits (LSI), which is a product of intellectual labor and referred to as intellectual property (IP), more specifically to a virtual component (VC) for use in a design of an integrated circuit described by a hardware description language (HDL).

BACKGROUND OF THE INVENTION

By utilizing recent improvements in simulation technology, circuit synthesis technology, and a hardware description language typified by VHDL (VHSIC (Very High Speed Integrated Circuit) Hardware Description Language) and Verilog-HDL, many designers of System-on-Chip (SoC) who realize an electronic circuit system on a chip as a large scale integrated circuit describe an operation specification of the circuit system by the hardware description language, and verify by a simulation CAD (HDL simulator) whether descriptions of this operation specification satisfy a requested function as system. Thereafter, these designers perform circuit synthesis, by using a synthesis tool, to logic circuits as gate-level description corresponding to the operation specification descriptions.

The designers seldom participate in all processes for designing the circuit system because there are strong demands recently to shorten a period necessary for designing the circuits. In a situation where the circuit system to be designed is divided for each of its functions, the designers often procure circuit design data at a hardware description language level as virtual components and combine these virtual components to assemble the circuit system. The circuit design data is often provided from vendors in specialized technical fields.

With an increase in system scale (circuit scale) and elevation in functional level of the circuit system, varieties of the virtual components to be combined tend to increase. Furthermore, the number of vendors offering the virtual components tends to increase. Accordingly, the system designers cannot ignore variations of qualities of circuits and operation verification standards for virtual components. Furthermore, because of high performance of the virtual components and competition among the vendors, concealment of internal information in the virtual components is promoted, that is, the virtual components tend to be made in the form of a black box. The system designers then have difficulty verifying the qualities of the virtual components.

Operation verification is very important before the manufacturing of LSI because it is very difficult to correct the design data for the LSI after manufacture. It is necessary to verify by a simulator or the like in a circuit design step before manufacturing whether a virtual component unit or the whole of the circuit system composed of a plurality of procured virtual components operate normally. When it is proved that the circuit system does not operate normally in the simulation, a part of the circuit causing the abnormal operation in this step should be detected and corrected.

Usually, the virtual components are guaranteed, by the vendors who are the providers thereof, to operate normally and are sold. For the above-described reasons users who are the system designers demand to verify the circuit system in their own way. Conventionally, when each of the users verifies a unit of the virtual component that they procured, the user prepares a driving circuit for use in verifying the virtual component, based on a specification (usually, only a specification concerning input/output terminals of the virtual components) and external conditions under which the virtual component operates within a limited range disclosed by the provider of the virtual component. Then, by use of a simulator, the user allows the virtual component to operate alone, thus verifying the virtual component. At this time, if the user judges operation of the virtual component to be abnormal, the user needs to detect a part where the problem occurred and to investigate a cause of the abnormality of the virtual component. To investigate the cause thereof, the user must perform an internal analysis of the virtual component thoroughly.

However, due to the high performance of the virtual component and the concealment of the internal information, the user is in a very difficult situation in performing the internal analysis for the virtual component and in detecting the spot where the abnormality originates. Furthermore, even if the driving circuit for use in verifying the virtual component made by the user independently causes the abnormality practically and the virtual component itself shows no abnormality, the user often performs an unnecessary internal analysis of the virtual component to detect the cause of the abnormality in consequence.

When the operation abnormality of the virtual components is confirmed in a step where the virtual components are combined into a system, the user has to perform an internal analysis of virtual components to determine the virtual component among the plurality of virtual components, which caused the abnormality, and to investigate the cause of the abnormality. However, for the above-described reason, it is difficult for the user to perform the internal analysis for each of the virtual components, and the user has to spare a considerable length of time to determine an abnormal virtual component among the virtual components and to take countermeasures to deal with the abnormality of the virtual component.

As described above, when an abnormal operation occurs in verifying the virtual component unit and the whole of the circuit system, the internal analysis for each virtual component is inevitable. However, due to the high performance of the virtual component and the concealment of the internal information, the internal analysis of the virtual component and the determination of the original spot in the virtual component where the abnormality occurred are becoming very difficult. Furthermore, the internal analysis of the virtual component requires enormous time and labor owing to its complexity, and a problem comes to occur in which advantages of shortening a design period, which is an original goal, cannot be obtained, the advantages for the user being first achieved by the virtual components procurement from the vendors.

BRIEF SUMMARY OF THE INVENTION

A computer readable medium encoded with a hardware description language describing a virtual component for an integrated circuit design, the virtual component according to an embodiment of the present invention comprising:

a virtual component body having at least one circuit function; and a verification-supporting circuit detachably connected to said virtual component body, said verification-supporting circuit being configured to support a verification of said virtual component body.

A method of verifying a virtual component for an integrated circuit design described by a hardware description language, according to an embodiment of the present invention, comprising:

simulating a virtual component unit described by the hardware description language or a circuit system including at least one virtual component unit, said virtual component unit being a circuit having at least one circuit function and comprising a virtual component body and a verification-output terminal detachably connected to said virtual component body so as not to affect a sole operation of said virtual component body even when a connection thereof to said virtual component body is cut; and outputting a signal indicating an operation state of said virtual component body through said verification-output terminal onto a display screen.

A computer readable medium encoded with a hardware description language describing a verification-supporting circuit of a virtual component, the verification-supporting circuit according to an embodiment of the present invention comprising:

a verification-output terminal configured to output a signal indicating an operation state inside of said virtual component, wherein the verification-supporting circuit is capable of being connected with or disconnected from said virtual component, said virtual component including an input terminal or an output terminal and at least one circuit function.

A computer readable medium encoded with a hardware description language describing a verification-supporting circuit of a virtual component, the verification-supporting circuit according to an embodiment of the present invention comprising:

a driving circuit configured to generate an operation clock and an emulation signal to be supplied to said virtual component so that said virtual component is enabled to be operated alone, wherein the verification-supporting circuit is capable of being connected with or disconnected from said virtual component, said virtual component including an input terminal or an output terminal and at least one circuit function.

A computer readable medium encoded with a hardware description language describing a verification-supporting circuit of a virtual component, the verification-supporting circuit according to an embodiment of the present invention comprising:

a monitor connection circuit configured to draw out a signal from a verification-output terminal, connected to said virtual component, said signal indicating an operation state inside of said virtual component, wherein the verification-supporting circuit is capable of being connected with or disconnected from said virtual component, said virtual component including an input terminal or an output terminal and at least one circuit function.

A method of manufacturing an integrated circuit, according to an embodiment of the present invention, comprising:

simulating a circuit system described by a hardware description language including at least one virtual component unit, said virtual component unit being a circuit having at least one circuit function and comprising a virtual component body and a verification-supporting circuit including at least a verification-output terminal detachably connected to inside of said virtual component body so as not to affect a sole operation of said virtual component body even when a connection thereof to said virtual component body is cut, and outputting a signal indicating a operation state of said virtual component body to the outside of said virtual component body through said verification-output terminal;

verifying said virtual component body and/or said circuit system based on said simulation result and said outputted signal;

performing a logic synthesis based on a circuit description of said circuit system without said verification-supporting circuit;

performing a placement and routing (P&R) based on a logic circuit obtained by said logic synthesis; and forming a real circuit on a substrate based on placement and routing (P&R) data of said circuit system subjected to said placement and routing (P&R).

A computer readable medium encoded with a hardware description language describing a virtual component for an integrated circuit design, the virtual component according to an embodiment of the present invention comprising:

a virtual component body having at least one circuit function; and a verification-output terminal configured to output a signal indicating an operation state inside of said virtual component body and being detachably connected to said virtual component body so as not to affect the operation of said virtual component body even when a connection of said verification-output terminal with said virtual component body is cut.

BRIEF DESCRIPTION OF THE DRAWINGS

A more complete appreciation of embodiments of the present invention and many of its attendant advantages will be readily obtained by reference to the following detailed description considered in connection with the accompanying drawings, in which:

FIGS. 2A to 2C are examples showing descriptions by a hardware description language of a virtual component for SoC according to an embodiment of the present invention;

FIGS. 3A and 3B are examples showing descriptions by a hardware description language of a verification tool for the virtual component for the SoC according to an embodiment of the present invention;

DETAILED DESCRIPTION OF THE EMBODIMENT

An embodiment of the present invention will be described with reference to the accompanying drawings.

Figure 1:
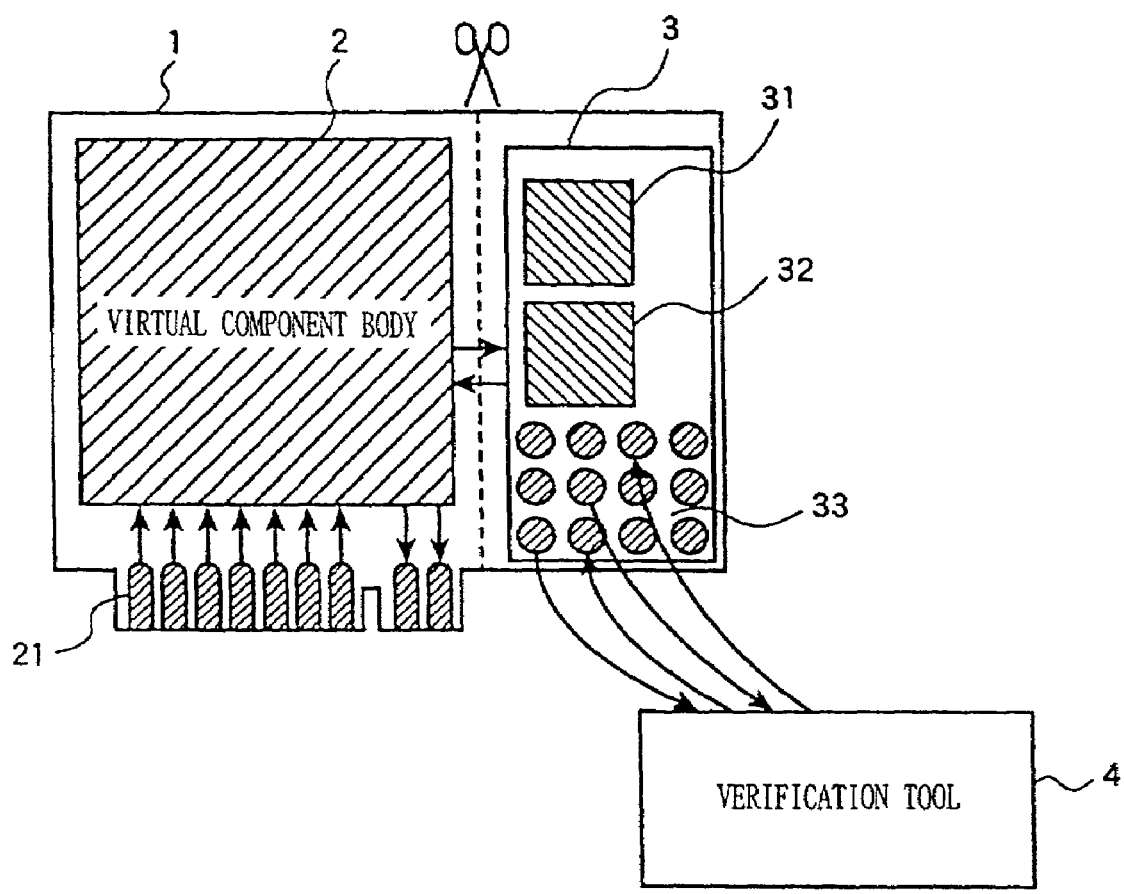
FIG. 1 is an example showing a schematic view of a virtual component for a SoC according to an embodiment of the present invention.

FIG. 1 is an example showing a schematic view of a virtual component described by a hardware description language, which is an embodiment of the present invention. In FIG. 1, although the virtual component is shown like a hardware structure in order to give explanation intelligible, it is file format like software in practice. Such a virtual component can be stored on many different computer readable mediums, such as, for example magnetic memories, optical memories, solid state memories or semiconductor memories, such a DRAMs, SRAMs, EEPROMs, flash memories, hard disk drives, floppy disks, CD-ROMs, DVDs, etc. Additionally, "computer" broadly refers to any data processing or data controlled device as well as the commonly understood microprocessors. The virtual component 1 that is an embodiment includes a virtual component body 2 having a specific circuit function described by the hardware description language and a verification-supporting circuit 3 similarly described by the hardware description language. This specific circuit function is for example, an MPEG2 decoder, a DSP (digital signal processor), etc.

The virtual component body 2 has input/output terminals 21 for connecting the virtual component 1 to other circuits. The provider of the virtual component discloses a specification of the input/output terminals 21, but typically does not disclose the details of the virtual component body 2. Instead, the provider usually subjects the virtual component body 2 to concealment processing for specific algorithm and information. In general, internal information about the virtual component body 2 obtained by users is mostly no more than that of the foregoing input/output terminals 21.

The verification-supporting circuit 3 is offered as the virtual component 1 in combination with the virtual component body 2, or offered independently of the virtual component body 2. The verification-supporting circuit 3 in the embodiment has a driving circuit 31 for enabling the virtual component body 2 to operate alone, verification-output terminals 33 for outputting a signal indicating an operation state inside of the virtual component body 2, and a monitor circuit 32 for outputting the signal indicating the operation state inside of the virtual component body 2 from the verification-output terminals 33. Note that the driving circuit 31, the verification-output terminals 33 and the monitor circuit 32 may be offered in the form of a unit as the verification-supporting circuit 3 from vendors, or may be offered individually.

The driving circuit 31 generates the clock signals and initialization signals supplied to the virtual component body 2. The driving circuit 31 performs a pseudo input/output of the signal to/from the virtual component body 2 for emulating an interface with the circuit system to be connected to the virtual component 1. The driving circuit 31 is previously connected to the virtual component body 2 by the provider of the virtual component 1 so that the virtual component body 2 can be operated alone or independently.

The monitor circuit 32 is offered by the provider of the virtual component 1 so that the operation state inside of the virtual component body 2 can be output to an external verification environment via the verification-output terminals 33 when the driving circuit 31 allows the virtual component body 2 to operate alone or when the virtual component body 2 operates after being incorporated in a circuit system to be designed.

The verification-output terminals 33 are connected to the internal portion of the virtual component body 2, and serve as terminals connected to a verification environment such as an external verification tool 4 when the virtual component is verified. A specification of the verification-output terminals 33 is previously disclosed to the users by the provider of the virtual component 1.

The verification-supporting circuit 3 is described by the same hardware description language as that describing the virtual component body 2, and is described so that the user can cut the connection of the verification-supporting circuit 3 with the virtual component body 2 as the need arises. Furthermore, the virtual component body 2 is described so that a normal circuit operation of the virtual component body 2 itself is not disturbed even when the connection of the virtual component body 2 with the verification-supporting circuit 3 is cut.

FIGS. 2A to 2C are an example of a description by the hardware description language of the virtual component 1 shown in FIG. 1. FIGS. 3A and 3B are an example of a description of the verification tool 4 by the hardware description language made by the user based on the specification of the verification-output terminals 33.

The example of the virtual component 1 will be described in more detail referring to FIGS. 2A to 2C.

Virtual Component 1

<Virtual Component Body 2>

[Input/Output Terminals 21]

In FIGS. 2A and 2B, a module called Compo 23A is described by the hardware description language. Herein, a specific circuit operation function (description portions following /* Circuit Description */, abbreviated in FIG. 2A) of the virtual component body 2 such as an MPEG2 decoder, for example, is described. Also, a plurality of input/output terminals 21 (the description portion /* Input Terminals */: in00sig, in01sig, . . . and /* Output Terminals */: out00sig, out01sig, . . . ) of the virtual component body 2 for which a specification is disclosed and a plurality of internal signal wires of the virtual component body 2 for which a specification is not disclosed (the description portion /* Internal Wire */: Internal100Wire, Internal101Wire, . . . ) are described and defined.

<Verification-Supporting Circuit 3>

[Verification-Output Terminals 33]

In this Compo23A, the verification-output terminals 33 (oStatusCode, oConditionCode, . . . ) are defined, and the connection of the verification-output terminals 33 and the virtual component body 2 is described. The specification of the verification-output terminals 33 is disclosed to the users by the provider. The specification, for example, has the following contents: "the terminal oStatusCode represents a state whether data can be input to an internal bus"; "the terminal oActiveRatio represents a state of a working rate of a bus"; "the terminal oChangeState represents a state of a change of the terminal oStatusCode", and the like.

Some description examples of the connection of the verification-output terminals 33 and the virtual component body 2 are shown below.

(1) An example of connection so as to directly output state of internal signal wire DESCRIPTION EXAMPLE "assign
oStatusCode=Internal84Wire;"

(Meaning: the terminal oStatusCode and the internal signal wire Internal84Wire are connected.)
(2) An example of connection so as to output computing result based on state among internal signal wires DESCRIPTION EXAMPLE "assign
oActiveRatio=Internal84Wire/Internal12Wire*100;"

(Meaning: a ratio (%) of a state signal of the internal signal wire Internal84Wire to a state signal of the internal signal wire Internal12Wire is connected to the terminal oActiveRatio.)
(3) An example of connection based on comparison result of states among internal signal wires DESCRIPTION EXAMPLE "assign
oChangeState=(Internal161Wire==Internal62Wire)?
1'b0:1'b1;"

(Meaning: a state signal of the internal signal wire Internal61Wire and a state signal of the internal signal wire Internal62Wire are compared, and a signal value 0 of one bit length binary system notation is connected to the terminal oChangeState when both states signal are in agreement with each other, and a signal value 1 of one bit length binary system notation is connected to the terminal oChangeState when both states signal are not in agreement with each other.)
(4) An example of connection based on state monitor result of internal signal wire DESCRIPTION EXAMPLE "assign oWaitCount=
(Internal34Wire==1'b0)?Internal43Wire:
Internal32Wire;"

(Meaning: a state signal of the internal signal wire Internal34Wire is monitored, and the terminal oWaitCount and the internal signal wire Internal43Wire are connected to each other when the state signal of the internal signal wire Internal34Wire is in agreement with the signal value 0 of one bit length binary system notation, and the terminal oWaitCount and the internal signal wire Internal32Wire are connected to each other when the state signal of the internal signal wire Internal34Wire is not in agreement with the signal value 0 of one bit length binary system notation.)
(5) An example of connection with register output holding state before state change of internal signal wire DESCRIPTION EXAMPLE
"always@(oChangeState)
rPreviousData=Internal22Wire;"

"assign oPreviousdata=rpreviousdata;"

(Meaning: a register rPreviousData stores a state signal of the internal signal wire Internal22Wire every time when a state signal output of the terminal oChangeState is changes, and the terminal oPreviousdata is connected to the signal in the register rPreviousData.)

As described above, the verification-output terminals 33 are connected to a signal indicating an operation state inside of the virtual component body 2.

When an option setting "Debug" is defined in verifying the virtual component, a signal from inside of the virtual component body 2 is output via each of the verification-output terminals 33 based on the foregoing connection. This connection is previously made by the provider of the virtual component 1, and this connection is made in consideration that an operation of the virtual component body 2 itself is not affected even when the connection of the verification-output terminals 33 and the virtual component body 2 is cut.

[Driving Circuit 31]

In FIGS. 2B and 2C, a module called Driver23A is described subsequently to the module called Compo23A. In Driver23A, the driving circuit 31 for allowing Compo23A to operate alone is described. In Driver23A, made is a circuit description for generating operation clocks (description portions following /* ClockDriver */), for generating a signal for use in emulation for the outside of the virtual component (description portions following /* Reset & Signal Generator */) and for inputting the generated signal to the input terminal 21 of the virtual component body 2 (description portions following /* Driving Terminals of Component */). This driving circuit 31 is previously connected to Compo23A by the provider of the virtual component 1 so that the driving circuit 31 drives Compo23A when an option setting "StandAlone" is defined ("'ifdef StandAlone") in verifying the virtual component 1.

[Monitor Connection Circuit 32]

In Driver23A, the monitor connection circuit 32 for outputting the operation state inside of the virtual component body 2 to the external verification environment via the verification-output terminals 33 is described. In the description example of FIG. 2C, when an option setting "ExternalMonitor" is defined in verifying the virtual component ("'ifdef ExternalMonitor"), the monitor connection circuit 32 includes an external verification tool called "DebugEnv" ("include "DebugEnv";"), and reads the monitor circuits made in the external verification tool.

Subsequently, an example of the verification tool 4 will be described in more detail referring to FIGS. 3A and 3B. After the descriptions of a name of signal data (description portions following /* Input Signal Data */) inputted to Compo23A in verifying the virtual component, in the verification tool 4 ("DebugEnv") shown in FIGS. 3A and 3B, described are the signal monitor circuit for monitoring an operation of the virtual component body 2 (description portions following /* Signal Monitor */), settings of verification conditions given to the virtual component 1 (description portions following /* Condition Settings for Debug */) and the status monitor circuit for monitoring a state of the virtual component 1 (description portions following /* Status Monitor */). Based on the name of the verification-output terminals 33 disclosed by the provider of the virtual component 1 and the specification thereof, this verification tool "DebugEnv" is made (described) by the user. The verification tool "DebugEnv" operates by defining the option setting "ExternalMonitor" when the virtual component 1 is verified. The verification tool "DebugEnv" is subjected to a circuit description so that operation status data of inside of the virtual component body 2 obtained via the verification-output terminals 33 of the virtual component 1 is output to be displayed on a display screen of a computer such as a workstation where a simulation verification is executed.

Next, the simulation verification for the virtual component 1 that is an embodiment of the present invention will be described.

Figure 4A:
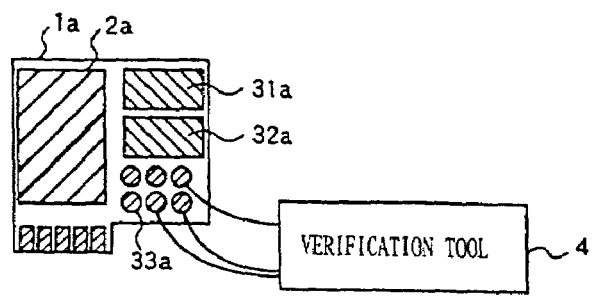
FIGS. 4A to 4C are examples of schematic views showing steps ranging from an introduction of the virtual component for the SoC according to an embodiment of the present invention to a circuit synthesis in order to generate a circuit system.
Figure 4B:
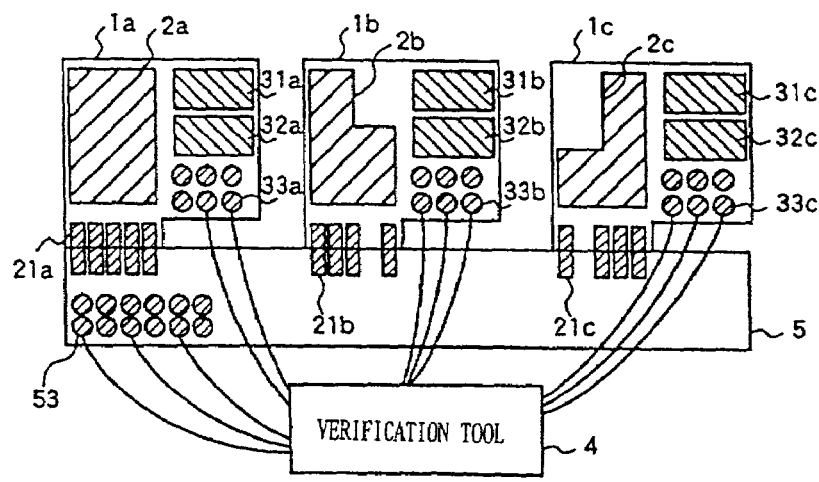
Figure 4C:
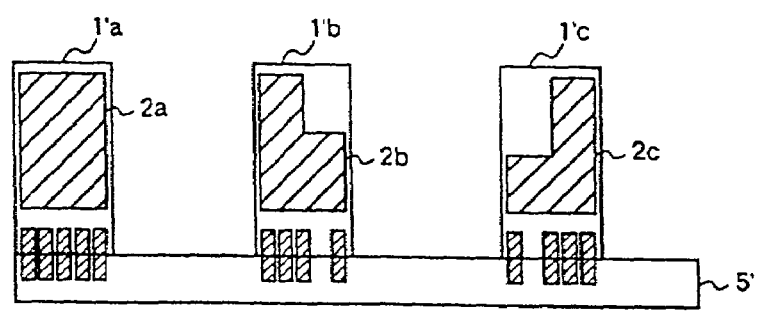

FIGS. 4A to 4C are schematic views showing an example of steps ranging from an introduction of the virtual component to a circuit synthesis (logic synthesis) for designing the circuit system, by use of the virtual component 1 shown in FIG. 1.

FIG. 4A is a drawing showing an example of a step in which the virtual component 1a alone is driven in introducing the virtual component 1a, and an operation verification of the virtual component body 2a and an evaluation thereof are carried out. FIG. 4A shows a relation among the virtual component body 2a, the verification-supporting circuit 3a, and the external verification tool 4. An operation verification the virtual component 1a described by the hardware description language is performed by a computer (workstation or the like) (not shown), in which a simulation program corresponding to the hardware description language operates.

When "Debug", "StandAlone" and "ExternalMonitor" are defined as the option settings in executing the simulation verification, an operation clock and a verification emulation signal are supplied to the virtual component body 2a from the driving circuit 31a added to the virtual component 1a, and the operation clock and the verification emulation signal allow the virtual component body 2a to operate independently. At this time, internal operation state data of the virtual component body 2a are monitored on the display screen of the computer via the verification-output terminals 33a, and it is possible to confirm a normal operation. It is also possible to perform an estimate of performance of the virtual component body 2a based on data obtained at this time as the need arises. When the confirmation of the normal operation of the virtual component body 2a cannot be obtained at this time, the virtual component body 2a contains a circuit abnormality, and an analysis of the virtual component body 2a is carried out to find causes of the abnormality. Thus, the causes of the abnormality are removed. In finding the causes of the abnormality, the internal operation state data of the virtual component body 2a obtained from the verification-output terminals 33a is useful.

FIG. 4B is a schematic view showing an example of steps for verifying and evaluating the whole of the circuit system when a circuit system 5 is constructed. The circuit system 5 is described by the hardware description language in such a manner that a plurality of virtual components 1a, 1b and 1c having different functions are combined. The virtual components 1a, 1b and 1c are connected as the circuit system 5, which is described by the hardware description language, via the input/output terminals 21a, 21b, and 21c, respectively, so that the circuit system 5 is constructed. Furthermore, verification-output terminals 53 for connecting the verification tool 4 thereto may be designed in the circuit system 5 as the need arises. The verification-supporting circuits 3a, 3b, and 3c are respectively connected to the virtual component bodies 2a, 2b, and 2c, and the verification-supporting circuits 3a, 3b, and 3c are constituted so as to be able to output the internal operation state data of the respective virtual component bodies 2a, 2b, and 2c via the verification-output terminals 33a, 33b, and 33c by the monitor connection circuits 32a, 32b, and 32c built therein.

When the "Debug" and "ExternalMonitor" are defined as the option settings in executing the simulation verification, the internal operation state data of the respective virtual component bodies 2a, 2b, and 2c in the operation of the circuit system 5 is monitored on the display screen of the computer through the respective verification-output terminals 33a, 33b, and 33c. Furthermore, when the verification-output terminals 53 are provided in the circuit system 5, it is also possible to monitor the operation state inside of the circuit system 5 as a whole. If an abnormality occurs in the operation of the whole of the circuit system, the data monitored is used for specifying the virtual component causing the abnormality. Even if no abnormality occurs in the operation of each of the individual virtual component units, combinations of the plurality of virtual components may not operate normally because of collisions of operation conditions among specific virtual components. However, since the operation state data inside the respective virtual components can be monitored simultaneously, the virtual component causing the collision can be easily specified, and time spent for countermeasures (circuit correction) can be shortened.

FIG. 4C is a schematic view showing an example of a circuit system 5' comprising by virtual components 1'a, 1'b, and 1'c. The verification-supporting circuits 3a, 3b, and 3c are separated from the virtual components 1a, 1b, and 1c after verifying the whole of the circuit system 5. When a logic synthesis is performed, it is possible to form a circuit system by the logic synthesis, in which the verification-supporting circuits 3a, 3b, and 3c are not synthesized as logic circuits, by inputting the circuit system 5' to a logic synthesis tool. To the circuit system 5', connected are the virtual components 1'a, 1'b and 1'c (virtual component bodies 2a, 2b and 2c) verified in the steps of FIGS. 4A and 4B. As described above, in the virtual component according to an embodiment of the present invention, the virtual component body and the verification-supporting circuit are connected so that the operation of the virtual component body is not affected even when the connection of the virtual component body and the verification-supporting circuit is cut. Accordingly, even when the verification-supporting circuit 3 is separated from the virtual component 1 after verification, the operation of the virtual component body 2 is guaranteed.

Separations of the verification-supporting circuits 3a, 3b, and 3c from the virtual components 1a, 1b, and 1c can be executed by nullifying all of the option settings "Debug", "StandAlone" and "ExternalMonitor" for the respective virtual components in inputting the circuit system into the logic synthesis tool, or by ignoring or deleting all descriptions relating to the option settings "Debug", "StandAlone" and "ExternalMonitor". Accordingly, the connections of the virtual component bodies 2a, 2b, and 2c and the verification-supporting circuits 3a, 3b, and 3c (the driving circuits 31a, 31b, and 31c; the monitor connection circuits 32a, 32b, and 32c; and the verification-output terminals 33a, 33b, and 33c) are cut.

Thereafter, the circuit system that has been subjected to the logic synthesis is subjected to placement and routing (P&R) processing, and then a corresponding mask is made. Subsequently, the circuit system undergoes predetermined manufacturing steps for manufacturing semiconductor devices based on the formed mask, such as implantation, etching, and the like, followed by forming real logic circuits such as transistors and wirings on a silicon substrate. Thus, the circuit system is finally manufactured as a SoC.

Figure 5:
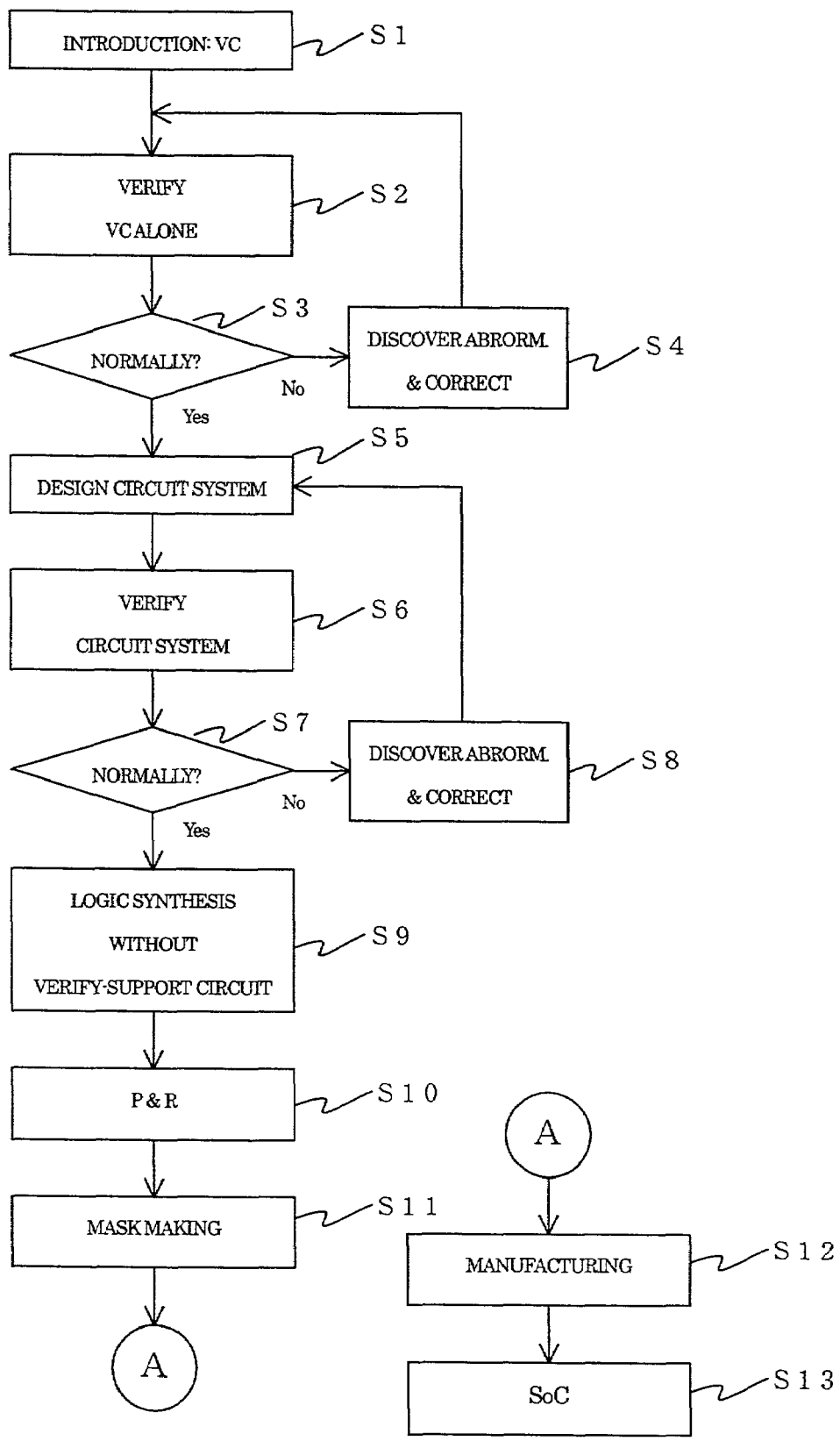
FIG. 5 is an example of a flowchart of a method for manufacturing a SoC using the virtual component for the SoC according to an embodiment of the present invention.

FIG. 5 is an example showing a flowchart of a method of manufacturing a SoC, which ranges from the introduction of the virtual component, which is an embodiment of the present invention, to the completion of the SoC through the verification and the logic synthesis.

In step S1, the designer performs the purchase/introduction of the virtual component having a specific function described by the hardware description language, which circulates in the market. Concerning the introduced virtual component, the designer performs the operation verification (simulation) of the virtual component unit by use of a simulator while monitoring an output from the verification-output terminals that are the verification-supporting circuit previously connected to the virtual component body (step S2). As a result of the operation verification (step S3), if the virtual component does not normally operate, the designer utilizes the monitor output from the verification-output terminals. The designer finds causes of the abnormality and corrects the causes of the abnormality (step S4).

When the operation of the virtual component unit does not show an abnormality, the designer designs the circuit system by use of the virtual component (step S5). After the design of the circuit system, the designer then performs the operation verification of the whole circuit system (step S6). At this time, the designer monitors the output from the verification-output terminals, which are provided in each of the virtual components and previously connected to the virtual component body. As a result of the operation verification (step S7), if the circuit system does not operate normally, the designer specifies a virtual component causing the abnormality by use of the monitor output from the verification-output terminals. At the same time, countermeasures (circuit correction) for this abnormality are taken on the provider side of the virtual component or on the introducer side thereof (step S8).

When the operation of the circuit system does not show an abnormality, the descriptions of the circuit system are input to the logic synthesis tool, and a logic synthesis is performed without the descriptions relating to the verification-supporting circuit among the descriptions of the circuit system (step S9). According to the structure of the virtual component of the embodiment of the present invention, only a circuit system in which the description relating to the verification-supporting circuit among the descriptions of the circuit system is removed can be subjected to the logic synthesis.

Thereafter, the circuit system that has been subjected to the logic synthesis is subjected to the placement and routing (P&R) processing (step S10), and then a corresponding mask is made (step S11). Based on the formed mask, predetermined manufacturing steps for manufacturing semiconductor devices such as implantation, etching and the like are performed (step S12), thus forming real logic circuits such as transistors and wirings on a silicon substrate. Thus, the circuit system is manufactured as a SoC (step S13).

According to the above-described manufacturing method of the SoC, since time spent for the operation verification of the circuit system is shortened, a period of time required for developing the SoC can be shortened.

Figure 6:
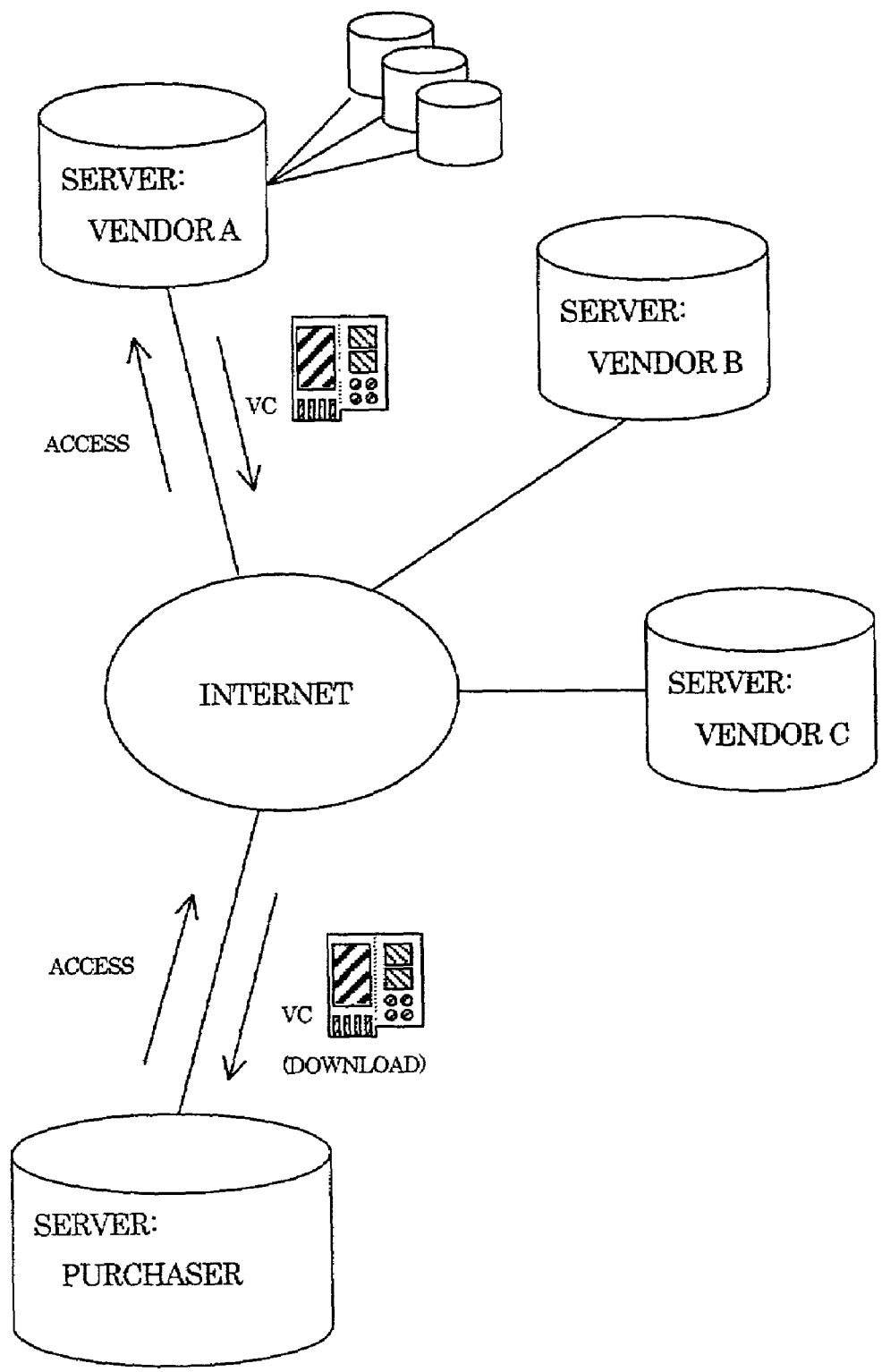
FIG. 6 is an example of a schematic view of a case where the virtual component for the SoC according to an embodiment of the present invention is distributed through the Internet.

Because the virtual component of the embodiment of the present invention is described by a hardware description language, the virtual component is also suitable for sales/distributions through the Internet. FIG. 6 is a schematic view of a virtual component according to the present invention distributed through the Internet. Each company as a vendor of the virtual component previously stores a prepared virtual component in a storage medium (ex. hard disk drives, etc.) connected to a server. The designer who wishes to use the virtual component provided by the vendor accesses the server to take a predetermined procedure, and then downloads a desired virtual component into his/her own hard disc or the like, whereby the designer purchases/introduces the virtual component. In the case of the introduction of the virtual component through the Internet, since the virtual component is not distributed through human hands and transportation means, the designer can introduce the desired virtual component without delay, and can shorten the period of time spent for design by a length of time that has been spent for the conventional distribution. Furthermore, since no distribution cost is spent, the vendor can provide the virtual component at a lower cost, and the designer can expect to purchase the virtual component at a lower cost.

Note that in selling the virtual component of an embodiment of the present invention, it is also possible to sell a unit of the verification-supporting circuit as an optional product corresponding to its virtual component body, that is, a separate product (separate description file) which is independent of the virtual component body, in addition to selling the virtual component body combined with the verification-supporting circuit. Also in this case, the connection of the virtual component body and the verification-supporting circuit must be previously set by the provider of the virtual component so as to be connectable. When the verification-supporting circuit alone is sold as a separate product, the user can purchase the verification-supporting circuit as a unit at the time when he/she needs the verification-supporting circuit after he/she purchased the unit of the virtual component body.

According to the above-described sales style, the verification-supporting circuit connectable to the virtual component body is previously added thereto by the provider of the virtual component, or the verification-supporting circuit can be sold/distributed independently of the virtual component body as an optional product corresponding to the virtual component body. Accordingly, the verification of the virtual component can be made easier for the purchaser of the virtual component, and a period of time spent for circuit system development can be further shortened compared to the conventional.

As described above, according to the virtual component for use in design of the SoC of the embodiment of the present invention, the verification-output terminals are provided, which are detachably connected to the virtual component body having specified circuit functions by the provider of the virtual component, and which are connected to the inside of the circuit of the virtual component body so that the sole operation of the virtual component body is not affected even when the connection of the verification-output terminals with the virtual component body is cut. Therefore, the operation verification of the virtual component is made easier for the user who purchased/introduced the virtual component, and in performing the logic synthesis, it is possible to perform the logic synthesis for only necessary the virtual component body. Accordingly, time spent for the operation verification of the circuit system at the hardware description language level and for the correction of the circuit system is more shortened compared to the conventional, and hence a period of time taken for development and manufacturing of the SoC can be further shortened.

While there has been illustrated and described embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed, but that the invention includes all embodiments falling without the scope of the appended claims.

What is claimed is:

1. A computer readable medium encoded with a computer program for causing a computer to execute a verification of a virtual component for an integrated circuit design described by a hardware description language, the verification comprising:

simulating a virtual component unit described by the hardware description language, said virtual component unit comprising a virtual component body having at least one circuit function and a verification-supporting circuit detachably connected to said virtual component body so as not to affect the circuit function of said virtual component body even when a connection thereof to said virtual component body is cut;

analyzing, by said verification-supporting circuit, abnormality of said circuit function based on a signal indicating an operation state of said circuit function;

outputting a result of analyzing said abnormality of said circuit function through a verification-output terminal of said verification-supporting circuit generating an operation clock and an emulation signal to simulate said virtual component body to operate alone; and supplying said operation clock and said emulation signal to said virtual component body when the simulating of said virtual component unit is performed.

2. The computer readable medium according to claim 1, the verification further comprising:

estimating a performance of said virtual component body based on said signal indicating an operation state of said circuit function.

3. The computer readable medium according to claim 1, the verification further comprising:

analyzing one or more causes of abnormality.

4. The computer readable medium according to claim 3, the verification further comprising:

removing said one or more causes of abnormality.

5. The computer readable medium according to claim 1, wherein the result of analyzing said abnormality of said circuit function is output to a display device.

* * * * *